April 18, 1967 J. W. BIRD 3,315,217

CONNECTOR FOR THIN FILM CIRCUITS

Filed March 19, 1965 3 Sheets-Sheet 1

INVENTOR.
JOSEPH W. BIRD

BY

Caesar, Rivise, Bernstein & Cohen

ATTORNEYS.

INVENTOR.

JOSEPH W. BIRD

BY

Caesar, Rivise, Bernstein & Cohen

ATTORNEYS.

CONNECTOR FOR THIN FILM CIRCUITS

Filed March 19, 1965

INVENTOR.
JOSEPH W. BIRD

BY

Caesar, Rivise, Bernstein & Cohen

ATTORNEYS.

United States Patent Office 3,315,217
Patented Apr. 18, 1967

3,315,217
CONNECTOR FOR THIN FILM CIRCUITS

Joseph W. Bird, King of Prussia, Pa., assignor to Elco Corporation, Willow Grove, Pa., a corporation of Pennsylvania Filed Mar. 19, 1965, Ser. No. 441,028
7 Claims. (Cl. 339—176)

This invention relates to a connector for thin film circuits, and more particularly, a device which supplies terminating means for thin film substrates, while at the same time supplying mechanical support for the substrate in the area of termination.

Although relatively new in the art, thin film circuits are now widely used in the electronics industry. These circuits comprise a relatively small thermal resistant substrate, such as ceramic or glass, and an extremely thin film of electronic components and circuitry vapor deposited on the surface of the substrate. The substrates generally used have a thickness of approximately 0.032 inch. The films, which are vapor deposited, have a thickness which is in the order of microns and, therefore, do nothing to significantly affect the overall thickness of the substrate.

The thin films possess a number of advantages over printed circuit boards. Thus, the thin films have smaller and thinner substrates. Additionally, the thin films comprise circuitry and components, since the technology has developed to a point where capacitors, resistors and inductors can be vapor deposited along with the circuitry. With printed circuit boards, only circuitry is printed on the substrate.

Although thin films have been found to be extremely useful in the electronics art, a problem has developed with respect to the connection of these films with other circuitry in a product. Thus, care must be taken in connecting external leads in view of the fact that the substrate comprises a relatively brittle, thin ceramic material. Ceramic is generally used because of the high temperature stability needed for the substrate during the vapor deposition of the films. Attempts to terminate the thin films in the past have included the use of relatively rigid wires crimped against the edge of the substrates. Thus, the thin film circuitry would terminate at spaced points along the edge of the substrate and the wires would be crimped in the same spacing. After the wires were crimped, they were passed under the substrate and would be glued to the back of the substrate. Obviously, this was a very time consuming method.

Another method of termination was to drill a series of spaced holes through the substrate. Thereafter, wires would be passed upwardly through these holes and wrapped around the edge of the substrate while passing over the terminated ends of the film circuitry. Again, the wires would be adhesively secured to the back of the substrate.

It is thus seen that in order to effectively terminate the circuits of a thin film, it is necessary to have physical contact with external leads, and in addition, means for securing the external leads to the substrate. The device of this invention effectively accomplishes the supplying of terminals to a thin film and the supporting of the thin film with the terminals in place.

It is, therefore, an object of this invention to provide a novel connector for thin film circuits.

It is another object of this invention to provide a connector for thin film circuits which automatically provides a securement of contact leads to the thin film circuits.

It is a further object of this invention to provide a connector for thin film circuits which will simultaneously connect external leads to the thin film circuits and support the substrate of the thin film circuits.

These and other objects of this invention are accomplished by providing a connector for thin film circuits comprising an insulating casing, spaced contact means secured within said casing and projecting out of said casing, said contact means having surfaces adapted to physically contact spaced circuits of said thin film circuits, and means on said casing adapted to maintain said thin film circuit in contact with said contacts.

Other objects and many of the attendant advantages of this invention will be readily appreciatetd as the same becomes better understood by reference to the following detailed description when considered in connection with the accompanying drawings wherein.

Figure 1:
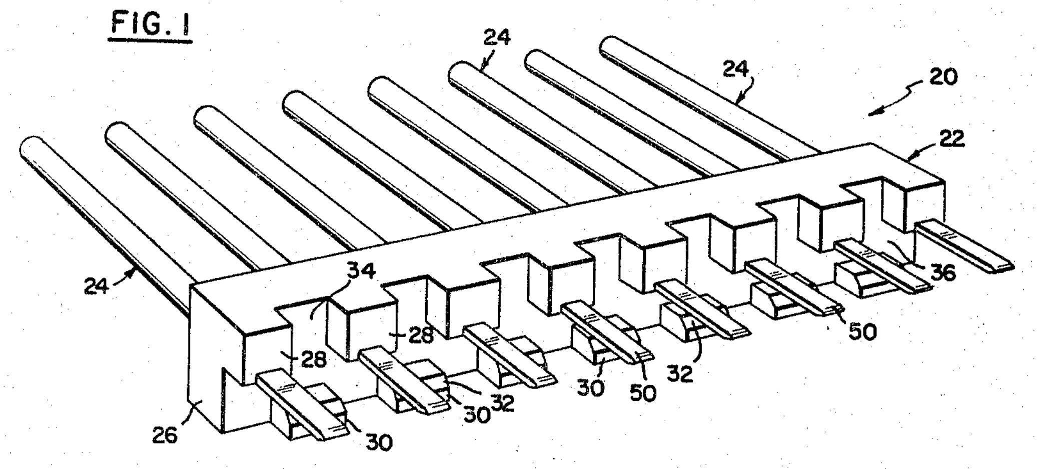
FIG. 1 is a perspective view of the connector of this invention.

Referring now in greater detail to the various figures of the drawings wherein similar reference characters refer to similar parts, a connector for thin film circuits embodying the present invention is generally shown at 20 in FIG. 1. Device 20 basically comprises an insulator 22 and a plurality of contacts 24 mounted therein.

Figures 2, 3, 4, 6:
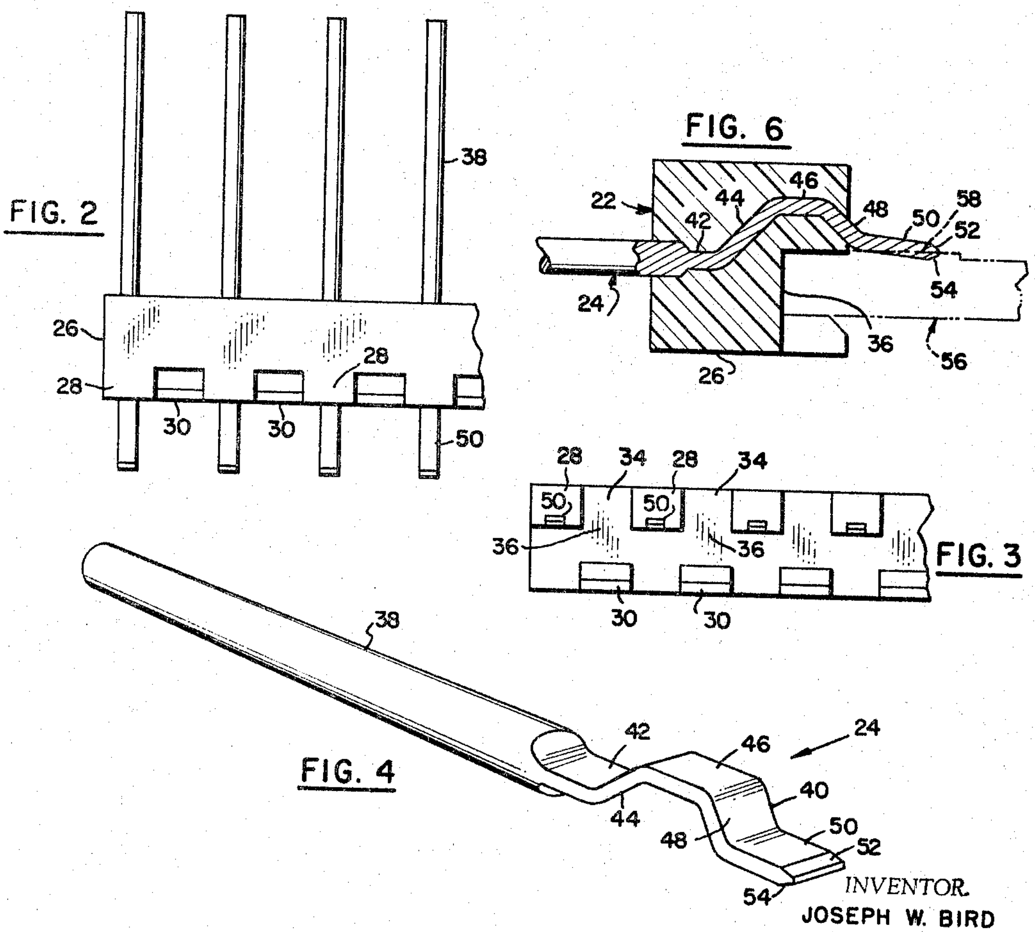
FIG. 2 is a top plan view of the connector of this invention.
FIG. 3 is a front elevational view of the connector of this invention.
FIG. 4 is a perspective view of a contact to be used in the connector of this invention.
FIG. 6 is a side sectional view showing one contact of this invention prior to contacting a thin film circuit, with a thin film circuit shown in phantom.

Insulator 22 comprises a rectangular block 26 having a plurality of spaced nibs 28 projecting from the upper portion of the forward wall thereof. A plurality of spaced shoulders 30 project from the lower portion of the forward wall of block 26. Each shoulder 30 includes a forward bevelled edge 32. As seen in FIG. 3, the nibs 28 are equally spaced and shoulders 30 are equally spaced, with the shoulders 30 being in the same vertical planes as the spaces 34 between nibs 28. However, as is apparent from FIG. 3, the shoulders are vertically displaced from nibs 28 leaving vertical gaps 36. As seen in FIGS. 1 and 6, gap 36 extends horizontally across the entire width of insulator member 22.

As seen in FIG. 4, each contact 24 includes a rear cylindrical portion 38 and a forward bladed portion 40, part of which is mounted in the insulator block and part of which defines the free end of the contact that projects forwardly from the insulator block beyond the free ends of nibs 28 and shoulders 30 and that overlies the upper surface of substrate 56 when the free edge of the latter is received in slot 36. Bladed portion 40 includes a first horizontal surface 42 which extends from cylindrical portion 38, an inclined portion 44 extending from horizontal portion 42, a second horizontal portion 46 extending from inclined portion 44, a second inclined portion 48 extending downwardly from horizontal portion 46 and a forward substantially horizontal portion 50 extending from inclined portion 48. As seen in FIG. 6, portion 50 is actually slightly downwardly inclined, as will be explained hereinafter. Portion 50 also includes upper and lower bevelled front edges 52 and 54, respectively. Contact member 24 is formed from cylindrical stock with the horizontal portions formed by a coining or swaging portion. After the forward portion has been flattened, the sides are trimmed to maintain the width of the flattened portion substantially the same as the diameter of the cylindrical portion.

Insulator 22 and its associated parts are all integrally molded with contact members 24 molded in the position shown in FIG. 6. Thus, the contact members will be substantially integral with the insulator in the final product; the inclined surfaces on the contact defining an undulated portion that insures against inadvertent removal of the contact from the insulator. If the contact passed straight through the insulator, there would be the possibility of its being pulled out.

Figure 5:
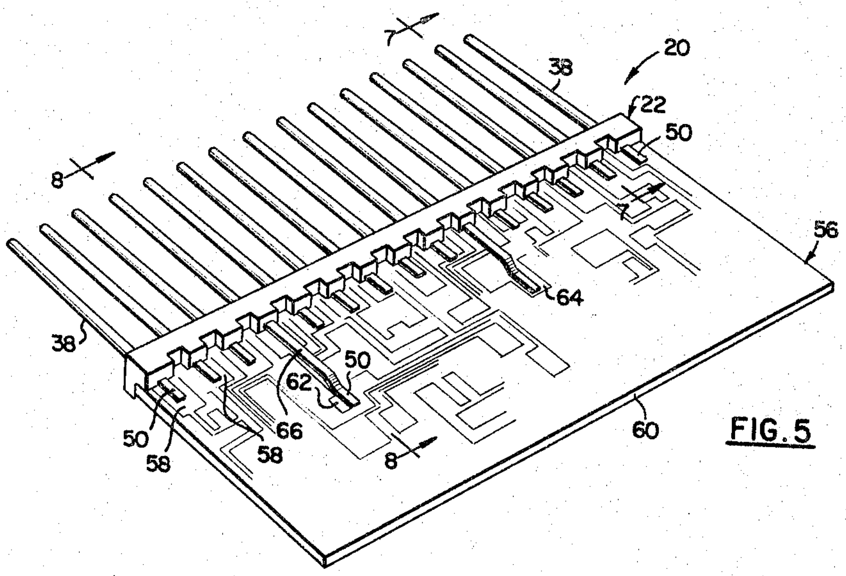
FIG. 5 is a perspective view of the connector of this invention with a thin film circuit shown diagrammatically in place.

In FIG. 5, a thin film circuit 56 is schematically shown. This circuit can include all of the circuitry and components of thin film circuits known to the art, such as resistors, capacitors, and inductors. The circuitry terminates in enlarged spaced portions 58 at one longitudinal edge of the substrate 60.

In use, thin film circuit 56 will be inserted into the recess 36 formed between shoulders 30 and nibs 28. Bevelled edges 32 and 54 aid in this insertion. The forward substantially horizontal portion 50 of contact 24 will abut the top of circuit 56. Since portion 50 is downwardly inclined and is formed of a metallic material, it possesses an inherent resiliency. Therefore, the resilient urging of portion 50 will provide a secure grip on the circuit 56. This gripping is sufficient to prevent the inadvertent removal of the circuit from the device of this invention.

Figure 7:
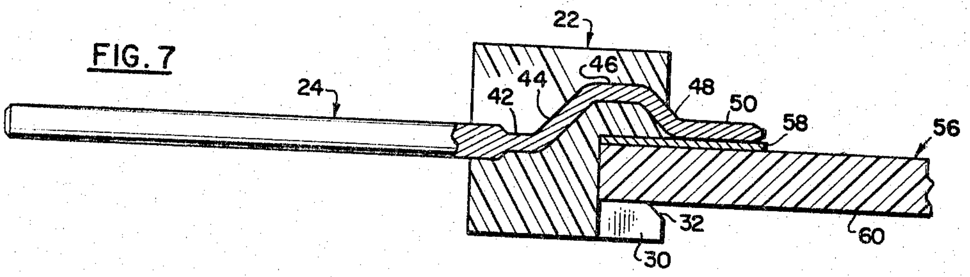
FIG. 7 is an enlarged sectional view taken along the line 7—7 of FIG. 5.

In FIG. 7, a thin film circuit 56 is shown as it will appear when secured in the device of this invention. For the purpose of illustration, the ends 58 of the circuitry have been shown as possessing a substantial thickness as compared with the thickness of substrate 60. However, this showing was merely made for the purpose of illustration. In reality, the thickness of the film is insignificant as compared to the thickness of the substrate. Thus, the substrates used for thin films normally have a thickness ranging from 0.010 to 0.047 inch whereas the vapor deposited circuitry has a thickness of approximately 200 to 400 microns. As further seen in FIG. 7, with the circuit 56 in place, the forward portion 50 of the contact will be substantially horizontal. In order to accommodate for any variations in thickness between the substrate and film 56 and the gap 36 which receives the substrate and film, the gap is made approximately 0.004 inch greater than the normal thickness of the substrate. The resilient grip of forward portion 50 will accommodate any slight variations in thickness.

Figure 8:
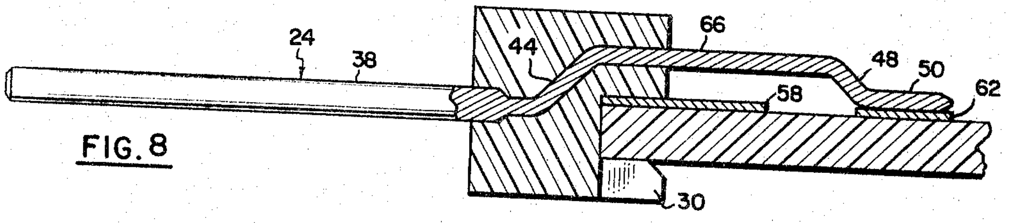
FIG. 8 is an enlarged sectional view taken along the line 8—8 of FIG. 5.

In some instances, the circuitry may not terminate at the edge of substrate 60. Thus, the circuitry may terminate at intermediate portions of substrate 60 as shown at 62 and 64 in FIG. 5. In this event, upper horizontal section 46 of the contact will be greatly extended in length, as shown at 66 in FIG. 8. In this way portion 50 of the contact will extend to the intermediate portion 62 of thin film circuit 56 and will contact portion 62 when the circuit is inserted into the device of this invention. Another advantage of having inclined surface 44 in the insulator is that horizontal section 66 is spaced sufficiently far from contact areas 58 to prevent shorting in the event a pinhole is formed in nib 28.

After the thin film circuit has been secured in place, as shown in FIG. 5, the contacts 50 are permanently secured to the circuitry with which they are in contact. This securement can be accomplished by any of the means known to the art for securing contacts in place. Thus, the contacts can be bar soldered. This is accomplished by providing copper contacts 24 and providing ends 50 with a solder plating. With the contact ends 50 in the position shown in FIG. 5, a heated bar is placed across their top surfaces. This bar will cause the solder plating on the contacts to fuse with the metal of vapor deposited circuit portions 58. To further insure this fusing, it would also be possible to solder plate terminal portions 58. Another method of securing the contacts in place would be to use Kovar contacts which could be welded in place. A third alternative would be to use aluminum contacts which could be sonically welded in place. In view of the fact that the substrate 60 of the thin film circuit comprises a temperature resistant ceramic or glass, none of these securing techniques will result in any damage to the thin film circuit.

The exposed circuitry portions 38 of the contacts are secured into electronic equipment by any of the methods known to the art. The most common of these methods would be to secure the ends 38 to printed circuit boards by the methods known to the art.

Insulator 22 can be made of any electrically insulating material. A thermosetting resin is preferred in view of the fact that heat would normally be required to secure ends 50 onto the thin film circuit. Thus, the resin can comprise a phenolic resin, such as Bakelite, an epoxy resin, or a polysulfone resin. However, any material having electrical insulating properties can be used. Therefore, polyethylene and polypropylene could also be adapted to this invention.

Figure 9:
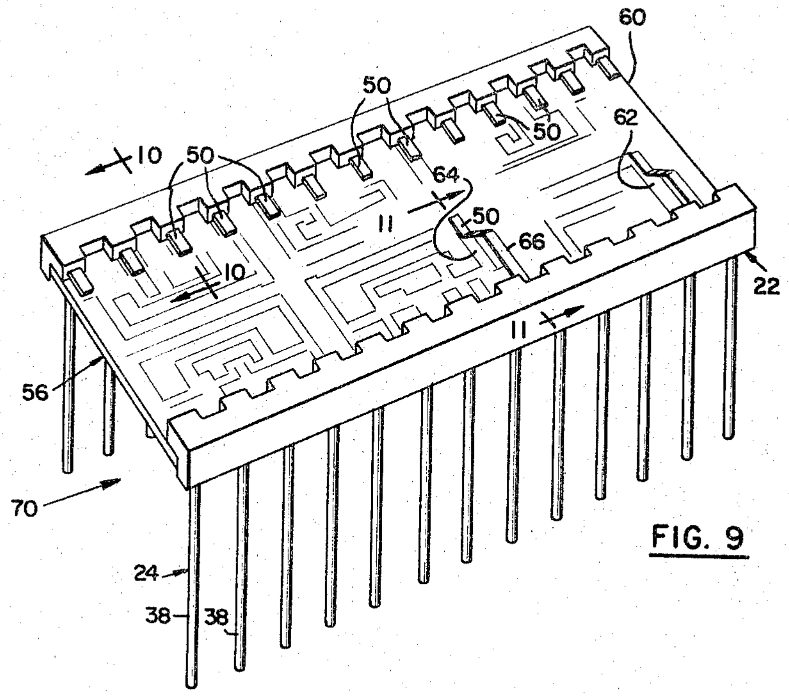
FIG. 9 is a perspective view showing a modified embodiment of the device of this invention secured to a thin film circuit.
Figures 10, 11:
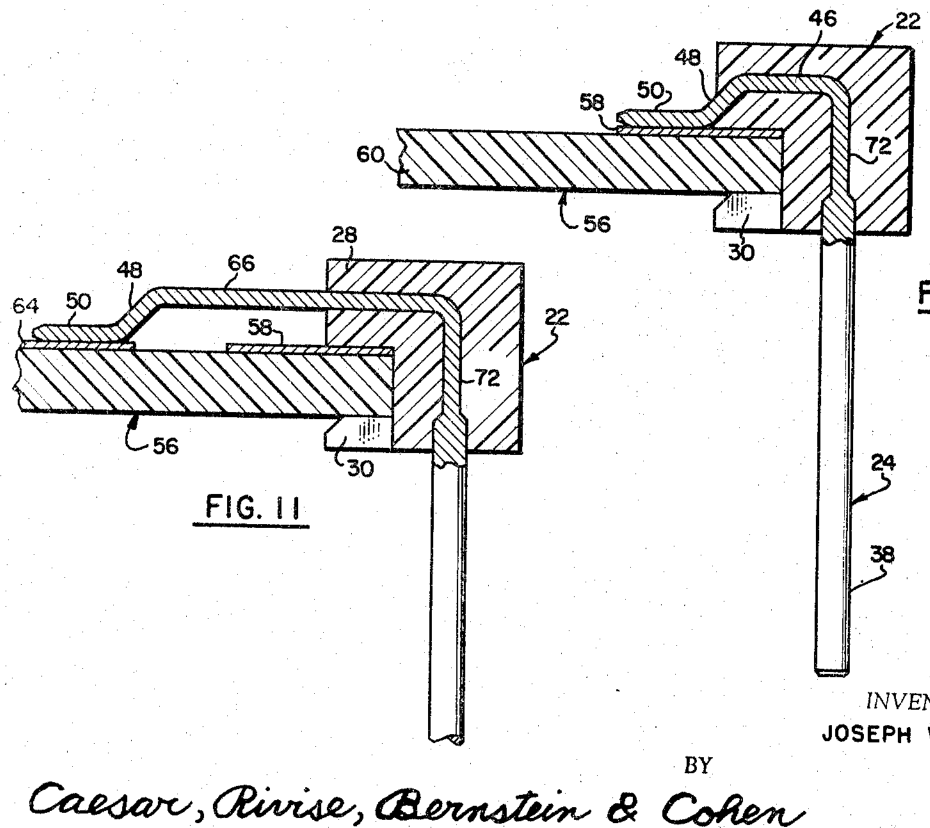
FIG. 10 is an enlarged sectional view taken along the line 10—10 of FIG. 9.
FIG. 11 is an enlarged sectional view taken along the line 11—11 of FIG. 9.

In FIG. 9, a modified embodiment of this invention is generally shown at 70. Embodiment 70 is substantially identical to embodiment 20 with the exception of the fact that cylindrical portions 38 of contacts 24 project vertically downward instead of horizontally outward and a pair of opposed insulators 22 are used instead of one. As seen in FIG. 10, contacts 24 are substantially the same as those previously described with the exception that horizontal portion 42 and inclined portion 44 have been replaced by a vertical portion 72 of the flattened end. As further seen in FIG. 10, portions 72 and 46 meet at right angles within insulator 22. All other elements of the device remain the same.

Device 20 is used when the thin film circuits are mounted vertically within an electronic device. The mounting shown at 70 in FIG. 9 is used when the thin film is to be mounted horizontally within an electronic device. Thus, the two spaced opposed devices in embodiment 70 will insure the proper support for the thin film circuit.

It is thus seen that the device of this invention will securely support contacts against the circuitry of a thin film circuit. Additionally, using the device of this invention the contacts can be secured in place by any of the securing methods known to the art. When it is desired merely to test a thin film circuit, temporary securement can be achieved merely by placing the circuit into the insulator 22 which will automatically cause an electrical connection between ends 50 of contacts 24 and the thin film circuits. After testing has been completed, the insulator and its associated contacts can easily be removed.

The device of this invention has been designed as being particularly adapted to thin film circuits wherein the edge leads of the circuit are spaced on 0.100 inch centers. However, the spacing can be varied to suit the needs of the user. Additionally, whenever necessary, the amount of extension of the contacts from the forward surface of the insulator 22 can easily be regulated according to the needs of the user. Thus, extended horizontal portions 66 can be used where necessary.

One feature of the device of this invention is the fact that there will be no lateral movement between the contacts and the vapor deposited film once the device of this invention has been secured in place. The prior art problem of securing wires arose from the fact that the wires secured to the thin film would tend to move after they had been so secured. This in turn caused damage to the extremely thin vapor deposited films, thereby destroying the efficiency or usability of the thin film circuits.

The flattened end portions 40 of the contacts are trimmed to the specific size in order to insure uniformity of dimension and mass of the contacts. This insures complete accuracy when this is required for a particular use.

The device of this invention can be used with other electrical contacts. However, the specific contact head 50 which is shown is preferred in view of the fact that in its flattened condition a more positive electrical contact is made with the circuitry on the thin film circuits. The shape of the rear section 38 can be cylindrical as shown or can be of any other shape such as square.

The spacing of the nibs 28 and shoulders 30 is used for ease of molding. However, when molding considerations are not a factor, a unitary nib 28 and a unitary shoulder 30 can pass transversely across the entire front face of block 26.

Obviously, many modifications and variations of the present invention are possible in the light of the above teachings. It is, therefore, to be understood that within the scope of the appended claims, the invention may be practiced otherwise than as specifically described.

What is claimed as the invention is:

1. A connector for use with a substrate having a surface with thin film circuitry thereon adjacent a free edge of the substrate, comprising:

(a) an insulator having a pair of forwardly extending projections that are spaced to define a slot adapted to receive the free edge of said substrate; and (b) a contact having a forward bladed portion, part of which is mounted in said insulator and part of which defines a free end of the contact that projects forwardly from said insulator beyond the free ends of said projections and that overlies said surface of said substrate when the free edge of the latter is received in said slot;

(c) the free end of said contact being flattened and inclined toward the surface of said substrate so as to be resiliently engageable with the thin film circuitry when the free edge of the substrate is received in said slot to establish electrical contact with such circuitry and retain the connector to the substrate.

2. A connecor according to claim 1 wherein at least a part of the bladed portion of the contact is also flattened, and is undulated in order to key the contact to the insulator.

3. A connector according to claim 2 wherein the undulated part of the said contact includes a horizontal part that is substantially parallel to, but positioned above, said surface of the substrate when the free edge of the latter is inserted in said slot, and a downwardly and forwardly inclined part which connects the horizontal part to the free end of the contact, said downwardly and forwardly inclined part being inclined relative to said horizontal part at an angle greater than the angle at which the free end is inclined relative to said horizontal part.

4. A connector/substrate combination comprising:

(a) an insulator having a pair of forwardly extending projections that are spaced to define a slot;

(b) a substrate having a free edge inserted in said slot, and a surface with thin film circuitry thereon adjacent said free edge; and (c) a contact having a forward bladed portion, which is mounted in said insulator and part of which defines the free end of the contact that projects forwardly from said insulator beyond the free ends of said projections and overlies the surface of said substrate;

(d) the free end of said contact being flattened and inclined toward the surface of said substrate and being resiliently engaged with the thin film circuitry thereon to establish electrical contact therewith and to retain the connector to the substrate.

5. The combination of claim 4 wherein the portion of the contact contained in the insulator is also flattened, and is undulated in order to key the contact to the insulator.

6. The combination of claim 5 wherein the undulated part of the said contact includes a horizontal part that is substantially parallel to but positioned above said surface of the substrate, and a downwardly and forwardly inclined part which connects the horizontal part to the free end of the contact, said downwardly and forwardly inclined part being inclined relative to said horizontal part at an angle greater than the angle at which the free end is inclined relative to said horizontal part.

7. The combination of claim 4 wherein the free end of the contact is mechanically attached to the thin film circuitry.

References Cited by the Examiner

UNITED STATES PATENTS

| | | | |
|---|---|---|---|
| 2,858,515 | 10/1958 | Thunander et al. | 339—17 |
| 2,923,911 | 2/1960 | Demurjian | 339—176 |
| 3,020,510 | 2/1962 | Kuch | 339—17 |

FOREIGN PATENTS

| | | |
|---|---|---|
| 584,989 | 9/1933 | Germany. |

EDWARD C. ALLEN, *Primary Examiner.*

W. DONALD MILLER, *Examiner.*